CRYOTRON LOGIC CIRCUITS HAVING AT LEAST TWO INTERACTING CENTRAL ELEMENTS AND ONE PATH ALWAYS SUPERCONDUCTING

Filed Dec. 10, 1962 2 Sheets-Sheet 1

INVENTOR.
PHILIP A. STOWELL
BY Charles R. Lepchinsky
ATTORNEY

CRYOTRON LOGIC CIRCUITS HAVING AT LEAST TWO INTERACTING CENTRAL ELEMENTS AND ONE PATH ALWAYS SUPERCONDUCTING

Filed Dec. 10, 1962 2 Sheets-Sheet 2

INVENTOR.
PHILIP A. STOWELL
BY Charles R. Hoffman (signature)
ATTORNEY 3,255,362

CRYOTRON LOGIC CIRCUITS HAVING AT LEAST TWO INTERACTING CENTRAL ELEMENTS AND ONE PATH ALWAYS SUPERCONDUCTING

Philip A. Stowell, Paoli, Pa., assignor to Burroughs Corporation, Detroit, Mich., a corporation of Michigan Filed Dec. 10, 1962, Ser. No. 243,243
12 Claims. (Cl. 307—88.5)

This invention relates to superconducting logic circuits and more particularly to superconducting logic circuits whose states are uniquely determined by the state of their inputs.

The cryotron, a relatively new development in the electronics art, utilizes the superconductive characteristics displayed by certain materials when held under conditions of very low temperature. In the absence of a magnetic field, certain materials will change from a resistive state to a superconducting state, in which their electrical resistance is zero, as their temperature is reduced below a certain critical temperature. A magnetic field applied to such materials will lower the temperature at which the transition from a resistive state to a superconducting state occurs. Accordingly, if a superconducting material is held at a constant temperature, a magnetic field of sufficient intensity will cause the superconducting material to enter the resistive or normal state.

A thin film cryotron is a device which utilizes these properties of superconducting materials and comprises, essentially, a gate portion which is separated, by a thin film of insulation, from a control portion which creates a magnetic field that controls the resistivity of the gate portion.

If the control element crosses the gate element at right angles to the direction of current flow through the gate, the device is known as a cross-film cryotron. More than one control element may cross the gate of a cross-film cryotron at different points along its length. If the control element is superimposed over the gate element and both extend in the same direction for some length, the device is known as an in-line cryotron.

Generally, the cryotron is deposited on the surface of a leaded film or "ground plane," which in turn is deposited on a suitable flat substrate such as polished aluminum or glass. Thin films of insulating material, such as silicon monoxide, of thickness comparable to that of the gate and control elements, are used to insulate overlapping conductors from each other and from the ground plane.

The operation of a cryotron is such that the superconducting gate portion may be made resistive by means of a magnetic field generated by passing at least critical current through the control element. Critical current may be defined as the smallest magnitude of current in the control that causes the gate to become resistive. Even though cryotron circuits must be refrigerated to very low temperatures, they have many advantages such as low power consumption, little or no electrical noise, high operating speeds, economical fabrication, occupy little space and are light weight etc., so that it can reasonably be expected that they will gain wide acceptance in the electronics art.

A cryotron may be described logically as true (superconducting) when critical control current is not present. If a first and second superconducting cryotron have their gate portions connected in parallel, thus forming two parallel current paths, to a source of current, the current will divide between the two superconducting current paths inversely to their respective inductances. By causing the gate element of the first cryotron to become resistive or normal by supplying at least critical current to its control element, the current will switch over from it to the gate of the second cryotron thus causing all of the current to flow through the superconducting gate portion of the second cryotron. However, when the gate of the first cryotron is allowed to become superconducting again, by decreasing the current flowing through its control to zero or less than critical, all of the current will continue to flow through the superconducting gate of the second cryotron. This is so because there can be no net flux change in a superconducting circuit, hence no E.M.F. is available to redistribute the current between the two cryotrons.

It is clear then, that the logical description of a cryotron does not state that the cryotron will be conducting current when critical control current is absent, only that it may so conduct current. Thus, the absence of critical control current becomes a "don't care" condition for a simple cryotron which is in parallel with a superconducting shunt path. Switching the gate of the second cryotron into its resistive or normal state will cause all of the current to flow through the gate of the first cryotron, but this requires a second control current.

Accordingly, heretofore in the prior art, a reliable way of obtaining the logical inversion function with cryotron circuitry has been elusive. Some prior art circuits do not have uniquely defined states but, rather, depend upon a desired current "winning" a time race with a second current which would otherwise leave the circuit in a different state, which results in an undesirable and unreliable circuit.

If it is required that current always flows through the inverter output circuit if critical control current is not present, and never does so if critical control current is present, then a second reset control current which is complementary to the presence or absence of critical control current cannot be used, since it is just this complement which it is necessary to generate. Of course, the gate of a cryotron may be shunted with a resistance which is much lower than the normal resistance of the gate. Then when critical control current is absent all the current will flow through the gate and when critical control current is present the current will divide between the gate and the shunt path with only a small portion flowing through the gate. This type of circuit will continuously dissipate energy when critical control current is present and its switching time will be slow.

These and other disadvantages of the prior art can be eliminated by a cryotron inverter circuit whose state is uniquely defined by only a single input and which always presents a superconducting path to current flow. With such an inverter circuit, any desired logical circuit can be fabricated without ever including a state in which continuous energy dissipation or a time race occurs by always including its logical complement in parallel with the desired logical function.

Accordingly an object of this invention is to improve superconducting logic circuits.

Another object of this present invention is to provide a superconducting logical inverter circuit whose state is uniquely defined by a single input.

Another object of this invention is to provide a superconducting logical inverter circuit whose state is uniquely defined by a single input and which always presents at least one superconducting path to current flow.

A further object of the present invention is to provide superconducting logic circuits in which continuous energy dissipation does not occur.

Still another object of this invention is to provide superconducting logic circuits in which a time race does not occur.

A still further object of this invention is to provide superconducting logic circuits in which the state of the logic circuits is uniquely determined by the state of the input or inputs.

These and other objects of the present invention are accomplished by utilizing a plurality of parallel superconducting current paths. Cryotron means, at least one of which contains a plurality of interacting control elements, are associated with each of the parallel current paths. Means are provided for applying an input to selected ones of the cryotron means. The cryotron means are intercoupled in such a manner that the implementation of the desired logic function in one or more of the parallel current paths is accompanied by the implementation of the complement of the desired logic function in the remaining parallel current paths.

More specifically, the present invention utilizes a plurality of parallel superconducting current paths to form a variety of logic circuits. At least one thin film cryotron, having a gate portion and a control portion, is associated with each said parallel current path. The gate portion of each cryotron is serially connected in its associated current path. At least one of the cryotrons has a single gate element and at least two interacting control elements such that the magnetic field applied to the single gate element, by passing current through the interacting control elements, is the sum or difference of the individual magnetic fields produced by each of the control elements. Means are provided for applying inputs to selected control elements of selected cryotrons. The control element or elements of selected cryotrons are coupled, by superconducting means, to the control element of one, some, or all of the cryotrons whereby the implementation of the desired logical function in one or more of said parallel current paths is accompanied by the implementation of the logic complement of the desired logic function in the remaining said current paths such that the state of the logic circuit is uniquely determined by the state of its inputs.

The exact nature of this invention as well as other objects and advantages thereof will be readily apparent from consideration of the following detailed description when considered in conjunction with the following drawings in which.

Figure 1A:
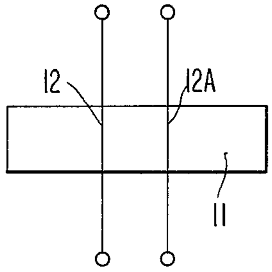
FIGS. 1A, 1B and 1C illustrate in schematic form various thin film cryotrons.

Referring now to the drawings, there is shown in FIG. 1A, in schematic form a typical thin film cryotron comprising a gate portion 11 and a control portion comprising the non-interacting control elements 12 and 12A. The operation of the cryotron shown in FIG. 1A is such that critical current flowing through either the control element 12 or 12A will generate a magnetic field that causes the superconducting gate portion or element 11 to become resistive in the region immediately under the current carrying control element. The control elements 12 and 12A are spaced apart along the length of the gate element 11 and do not interact in any way. Inasmuch as the control elements 12 and 12A are always superconducting, they are constructed of a superconducting material whose critical magnetic field is greater than the critical magnetic field of the material of the superconducting gate 11. For example, if the gate 11 is made of tin, the control elements 12 and 12A may be made of lead.

Figure 1B:
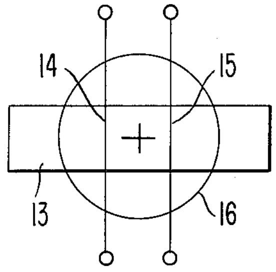

Referring now to FIG. 1B there is illustrated, in schematic form, a thin film cryotron having a gate portion or element 13 and a control portion comprising the interacting control elements 14 and 15. This cryotron is constructed with the control elements 14 and 15 superimposed over one another where they cross the gate element 13 and are separated by an appropriate layer of insulating material (not shown). Inasmuch as the control elements 14 and 15 are superimposed and are located on one side of the gate element 13, the magnetic fields generated by passing a current in the same direction through each of the control elements 14 and 15 combine additively in the region of the gate 13. Conversely, if current is applied to control elements 14 and 15 in opposite directions, the magnetic field generated by each control element 14 and 15 subtract from each other in the region of the gate 13. Thus, the net effect of the control elements 14 and 15 on the gate element 13 is determined by the magnitude and relative directions of the currents flowing in the control elements. For example, if critical current is applied to either or both of the control elements 14 and 15 in the same direction, the gate element 13 will be resistive, that is, normal; and if critical control current is applied to neither or both the control elements 14 and 15 in opposite directions, the gate element 13 will remain superconducting. Also, if one-half critical current is applied to each of the control elements 14 and 15, the gate 13 will be resistive for currents in the same direction but will remain superconducting when the currents flow in opposite directions.

The circle 16 surrounding the intersection of the control elements 14 and 15 with the gate element 13 indicates that the control elements 14 and 15 interact because they are superimposed on each other over the gate element 13. The plus (+) sign located between the control elements 14 and 15 indicates that the magnetic fields generated by each of the control elements, by passing current through the control elements 14 and 15 in the same direction, combine additively.

Figure 1C:
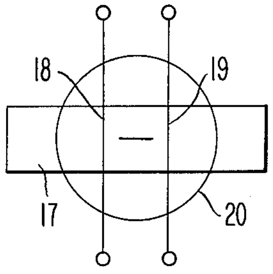

Referring now to FIG. 1C, there is illustrated in schematic form a thin film cryotron comprising the gate element or portion 17 and a control portion comprising the interacting control elements 18 and 19. This cryotron is constructed with the control elements 18 and 19 superimposed over each other where they cross the gate 17 but the gate 17 is located between them. Accordingly, the magnetic fields generated by passing current through the control elements 18 and 19 in the same direction combine subtractively in the region of the gate 17. Conversely, the magnetic fields created by control currents crossing the gate in opposite directions add to one another in the region of the gate 17. Thus, the effect of the control elements 18 and 19 on the gate element 17 is determined by the magnitude and relative direction of the current applied to the control elements 18 and 19. For example, if critical control current is applied to neither or both of the control elements 18 and 19 in the same direction, the gate element 17 will remain superconducting. However, if critical current is applied to either or both of the control elements in opposite directions, the gate element 17 will be resistive, that is, normal. Also if one-half critical current is applied to each of the control elements 18 and 19, the gate 17 will remain superconducting for currents in the same direction but will go resistive when the currents flow in opposite directions.

The circle 20 indicates that the superimposed control elements 18 and 19 interact and the minus—sign between the control elements indicates that the magnetic fields of the control elements 18 and 19 combine subtractively for currents in the same direction.

It is to be understood that additional interacting control elements may be added to the thin film cryotrons illustrated in FIGS. 1B and 1C. Any additional control elements must necessarily be on top of one or the other of the two control elements which are immediately adjacent to the gate element. Therefore, the magnetic fields of additional control elements will combine additively with the magnetic field of the first control element on the side of the gate element on which they are located, when their currents cross the gate element in the same direction. In other words, all control elements on either side of the gate interact additively. The net result of current flowing through a plurality of control elements on both sides of a single gate element can be determined by taking the algebraic difference, between the algebraic sum of the control currents on one-half of the gate element and the algebraic sum of the control currents on the other side of the gate element, by using algebraic signs for the various individual currents according to their relative directions across the gate element.

It will be shown herein below in detail, that by utilizing the cryotron characteristics discussed above in a novel manner, any desired logical function can be fabricated, without including a state in which continuous energy dissipation or time race occurs, by always including the logical complement in parallel with the desired logical function thereby causing the state of the logic circuit to be uniquely determined by the state of its input.

Figure 2:
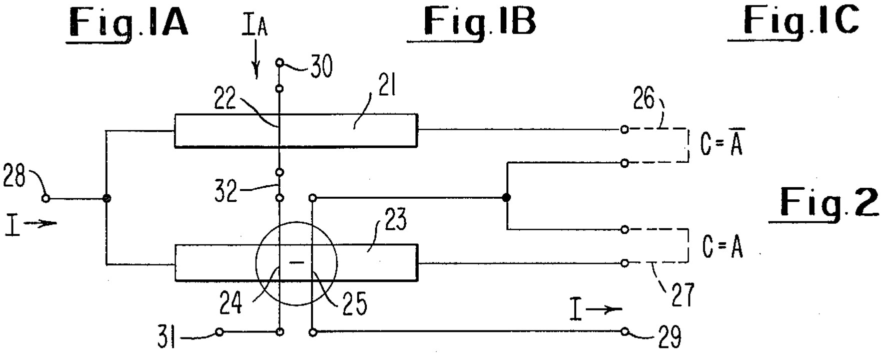
FIG. 2 is a schematic illustration of a superconducting logical inverter circuit.

Referring now to FIG. 2, there is illustrated in schematic form a superconducting logical inverter circuit which operates in accordance with the principles of the present invention and comprises first cryotron means, such as the gate element 21 and its single corresponding control element 22, and second cryotron means, comprising the gate element 23 and first and second interacting control elements 24 and 25 respectively. The gate element 21 of the first cryotron means is connected in parallel with the gate element 23 of the second cryotron means to form two parallel superconducting paths. A current I is applied between the terminals 28 and 29. Superconducting output circuits 26 and 27 are serially connected in each of the two parallel current paths. These output circuits 26 and 27 may comprise the control element of output cryotrons (not shown). The control element 22 of the first cryotron means is connected to the first control element 24 of the second cryotron means by way of the superconducting lead 32. The second control element 25 of the second cryotron means is coupled to receive the current that may flow in either of the two parallel paths, that is, the total current I. A source of current pulses $I_A$ to be inverted may be applied to terminals 30 and 31, flowing into terminal 30.

The operation of the logical inverter circuit shown in FIG. 2 is such that, in the absence of a current pulse $I_A$ between terminals 30 and 31, current I enters the terminal 28 and flows through the gate element 21 of the first cryotron means, through the superconducting output means 26, through the control element 25 of the second cryotron means, and out of terminal 29. The current I flowing through the second control element 25 of the second cryotron means is of sufficient magnitude to cause the gate element 23 to become resistive. Therefore, no current I will flow through the gate element 23 of the second cryotron means to the output means 27. Accordingly, in the absence of a current input pulse $I_A$, current flows through the output means 26 which denotes the logical function of the absence of an input $I_A$ to the terminal 30, that is, the complement of the logical inversion function.

Assume now that a current pulse $I_A$ is applied between the terminals 30 and 31: The pulse current $I_A$ flows through the control element 22 of the first cryotron means and causes the gate element 21 to become resistive. The pulse current $I_A$ also simultaneously flows through the first control element 24 of the second cryotron means and out of the terminal 31 at the same time that current I is flowing in the second control element 25. Since current now flows in the same direction through the first and second control elements 24 and 25 respectively of the first cryotron means the magnetic fields created thereby combine subtractively in the region of the gate 23, causing the gate element 23 to become superconducting. Inasmuch as the gate element 21 of the first cryotron means is now resistive and the gate element 23 of the second cryotron means is now superconducting, all of the current I applied to the terminal 28 now flows through the gate element 23 of the second cryotron means, through the superconducting output means 27, through the second control element 25 of the second cryotron means, and out of the terminal 29. The current I flowing through the superconducting output means 27 indicates the presence of the current pulse $I_A$ which is applied between terminals 30 and 31.

Upon termination of the current pulse $I_A$, current will no longer flow through the control element 22 of the first cryotron means or the first control element 24 of the second cryotron means thereby causing the gate element 21 of the first cryotron means to become superconducting and the gate element 23 of the second cryotron means to become resistive, inasmuch as current now only flows through one of the two interacting control elements 24 and 25, namely, the second control element 25. Thus, all of the current I will switch over and flow through the superconducting gate element of the first cryotron means, through the superconducting output means 26, through the second control element 25, and out of the terminal 29. Current flowing through output means 26 indicates that the current pulse $I_A$ is no longer present.

It is clear from the detailed description given above, that in the logical inverter circuit shown in FIGURE 2 current always flows through the gate element 21 of the first cryotron means if the current pulse $I_A$ is not present and current never flows through the gate element 21 if the current pulse $I_A$ is present. It should be noted that this has been accomplished without a second reset current which is complementary to the presence or absence of the current pulse $I_A$. Accordingly, the state of this logical inverter circuit is uniquely defined by a single input and the logical inverter circuit always presents a superconducting path to the current I. Also, it should be noted that the logical inverter circuit of FIG. 2 does not have a continuous energy dissipation state nor does a time race occur. This is accomplished by including the complement of the inversion function in parallel with the desired inversion function. As will be shown herein below in detail, the principles of this logical inverter circuit, illustrated in FIG. 2, can be utilized to fabricate any desired logical function. Note also that although the logical inverter circuit of FIG. 2 utilizes the gate of FIG. 1C, the gate of FIG. 1B can as well be used in its place providing the relative direction of either, but not both, I or $I_A$ is reversed.

Figure 3A:
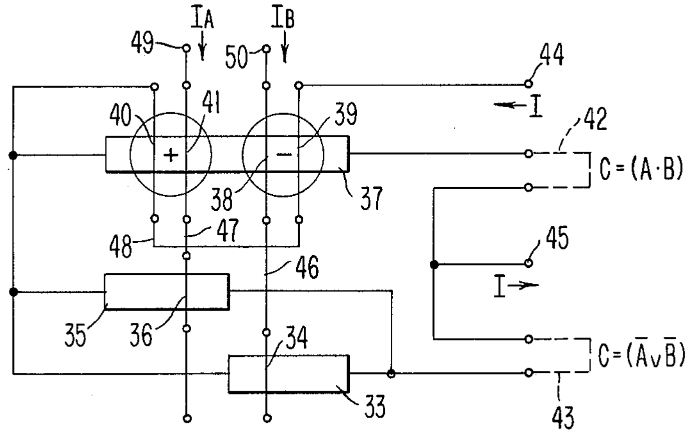
FIGS. 3A and 3B are schematic illustrations of superconducting logical AND gates.

Referring now to FIG. 3A there is illustrated in schematic form an AND gate including first cryotron means comprising the gate element 33 and the control element 34, second cryotron means including the gate element 35 and the control element 36, and third cryotron means comprising the gate 37 having two pairs of interacting control elements 38, 39, and 40, 41 respectively. The gate elements 33, 35 and 37 of each control means are connected to form three parallel current paths. Superconducting output means 42 is connected in series with the parallel current path comprising the third cryotron means and superconducting output means 43 is adapted to receive the current that flows in the two parallel current paths associated with the first and second cryotron means. A source of current I is connected between terminals 44 and 45 which causes current to flow into terminals 44 and out of terminal 45. The control element 34 of the first cryotron means is coupled to the control element 38 of the third cryotron means by way of the superconducting lead 46, the control element 36 of the second cryotron means is coupled to the control element 41 of the third cryotron means by way of the superconducting lead 47, and the control element 39 of the third cryotron means is coupled to the control element 40 of the third cryotron means by way of the superconducting lead 48. A first current pulse $I_A$ may be applied to terminal 49 and a second current pulse $I_B$ may be applied to terminal 50.

In the absence of first and second current pulse inputs $I_A$ and $I_B$, the current I flows into terminal 44, through the control elements 39 and 40 of the third cryotron means which renders the gate element 37 resistive, divides and flows in parallel through the gate element 35 of the second cryotron means and through the gate element 33 of the first cryotron means, rejoins and flows through the superconducting output means 43, and out of the terminal 45.

Assume now that a first current pulse $I_A$ is applied to terminal 49 causing current $I_A$ to flow into the terminal 49, critical current now flows through the control element 41 of the third cryotron means. Because this pulse current $I_A$ flows in a direction opposite to that of the current I flowing in the control element 40 of the third cryotron means, the left side of the gate 37 of the third cryotron means will become superconducting. However, because the current I also flows through the control element 39 of the third cryotron means, the right side of the gate element 37 of the third cryotron means will be resistive thereby preventing any current I from flowing into the gate element 37. Simultaneously, the first pulse current $I_A$ also flows through the control element 36 of the second cryotron means thereby rendering the gate element 35 resistive. Since the gate element 35 of the second cryotron means is now resistive, all of the current I now flows through the superconducting gate element 33 of the first cryotron means, through the superconducting output means 43 and out of the terminal 45. After termination of the first current pulse $I_A$ the gate element 35 of the second cryotron means again becomes superconducting but the current I will not now flow into the superconducting gate 35 because there can be no flux change in a superconducting circuit.

Assume now that a current pulse $I_B$ is applied to the terminal 50 causing current $I_B$ to flow into the terminal 50. This causes current $I_B$ to flow through the control element 38 of the third cryotron means in the same direction as the current I in the control element 39 of the third cryotron means. Since the magnetic fields created by current flowing in the control elements 38 and 39 combine subtractively, the right side of the gate element 37 of the third cryotron means becomes superconducting. However, inasmuch as there is no current flowing in the control element 41 of the third cryotron means to counter the affect of the current I flowing in the control element 40, the left side of the gate element 37 of the third cryotron means remains resistive. Simultaneously, the second current pulse $I_B$ also flows through the control element 34 of the first cryotron means rendering its gate element 33 resistive. Accordingly, the current I applied to terminal 44 now flows through the control elements 39 and 40 of the third cryotron means, through the gate element 35 of the second cryotron means, through the superconducting output means 43, and out of the terminal 45. It is obvious from the description given herein above that current flowing in the superconducting output means 43 satisfies the logical function of the absence of either or both of the first $I_A$ and second $I_B$ current pulse inputs.

Assume now that both the first $I_A$ and second $I_B$ current pulse inputs appear on the terminal 49 and 50 respectively. For this condition the first pulse current $I_A$ flows through the control element 36 of the second cryotron means and renders the gate element 35 resistive. The first current pulse $I_A$ also renders the left side of the gate element 37 of the third cryotron means superconducting because it flows in a direction opposite the current I which appears in the control element 40. The second pulse current $I_B$ flows through the control element 34 of the first cryotron means rendering the gate element 33 resistive. The second current pulse $I_B$ also flows through the control element 38 of the third control means in the same direction as the current I flowing through the control element 39 thereby rendering the right side of the gate 37 superconducting. It is clear then that the gate element 37 of the third control means is superconducting and the gate elements 35 and 33 of the second and first cryotron means are resistive. Thus, the current I which enters the terminal 44 flows through the control element 39 of the third cryotron means, through the superconducting lead 48, the control element 40 of the third cryotron means, through the superconducting gate element 37 of the third cryotron means, the superconducting output means 42, and out of the terminal 45. It is clear then that the current I flowing through the superconducting output means 42 indicates the logical function that both the first $I_A$ and second $I_B$ current pulses appear on the terminals 49 and 50 respectively, that is, the circuit of FIG. 3A functions as an AND gate which also generates the complement of the AND function. It is also clear from the description above, that the implementation of the AND function in one of the parallel paths, formed by the first, second and third cryotron means, is accompanied by the implementation of the complement of the AND function in the remaining parallel current paths such that the state of the superconducting AND gate, illustrated in FIG. 3A, is uniquely determined by the state of the inputs $I_A$ and $I_B$.

Figure 3B:
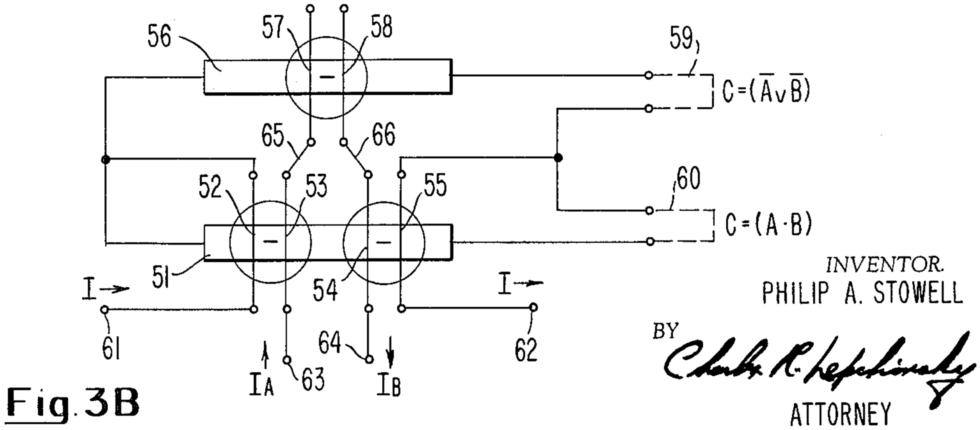

Referring now to FIG. 3B, there is illustrated in schematic form another embodiment of an AND gate including first thin film cryotron means comprising the gate element 56 having a pair of subtractively interacting control elements 57 and 58, and second cryotron means comprising the gate element 51 having two pairs of subtractively interacting control elements 52, 53 and 54, 55 respectively. The gate elements 51 and 56 of the first and second control means respectively are connected in parallel to form two parallel superconducting current paths. Superconducting output means 59 is serially connected in the parallel path associated with the gate element 56 of the first cryotron means and superconducting output means 60 is serially connected in the parallel current path associated with the control element 51 of the second cryotron means. A source of current I is applied between the terminals 61 and 62. The control elements 53 and 54 of the second cryotron means are coupled to the control elements 57 and 58 of the first cryotron means respectively by way of the superconducting leads 65 and 66. The control element 55 of the second cryotron means is adapted to receive the current that flows in either of the two parallel current paths and the control element 52 of the second cryotron means is adapted to receive the current I which is applied to the terminal 61.

A first current pulse $I_A$ is applied to terminal 63 which causes current to flow into the terminal 63 and a second current pulse $I_B$ is applied to terminal 64 which causes current to flow out of the terminal 64. The current pulses $I_A$ and $I_B$ have a magnitude that is less than critical current but at least one-half critical current for the gate element 56 of the first cryotron means. However, the magnitude of the current pulses $I_A$, $I_B$ have a magnitude at least equal to critical current for the gate element 51 of the second cryotron means. Inasmuch as the critical control current for a thin film cryotron is proportional to the width of the control element of the cryotron, it is a simple matter to proportion the width of the control elements of the first and second cryotron means such that the magnitude of the current pulses $I_A$, $I_B$ is at least equal to critical value for one cryotron means and less than critical but at least one-half of critical for the other cryotron means.

In the absence of the $I_A$ and $I_B$ current pulses on the terminals 63 and 64 respectively, the current I applied to the terminal 61 flows through the control element 52 of the second cryotron means rendering the left side of the gate element 51 resistive, through the gate element 56 of the first cryotron means, through the superconducting output means 59, through the control element 55 of the second cryotron means which renders the right side of the control element 51 resistive, and out of the terminal 62. Assume now that a first current pulse $I_A$ is applied to the control element 53 of the first cryotron means by way of the terminal 63. This renders the left side of the gate element 51 of the second cryotron means superconducting. However, the right side of the gate element 51 remains resistive due to the current I flowing in the control element 55. The first current pulse $I_A$ simultaneously flows through the control element 57 of the first cryotron means but does not render the gate element 56 resistive because of the magnitude of the first current pulse $I_A$ is less than critical value as explained herein above. Accordingly, the current I continues to flow through the gate element 56 of the first cryotron means, through the superconducting output means 59, the control element 55 and out of terminal 62. The path for the current I remains the same after termination of the first current pulse $I_A$.

If the second current pulse $I_B$ appears on the terminal 64, the right side of the gate element 51 of the second cryotron means becomes superconducting but the left side of the control remains resistive due to the current I flowing in the control element 52. The second current pulse $I_B$ also flows through the control element 58 of the first cryotron means but does not render the gate element 56 resistive because its magnitude is less than critical for the first cryotron means. Therefore, when the second current pulse $I_B$ occurs on terminal 64, the current I continues to flow through the superconducting output means 59. It is clear then, that current I flowing through the superconducting output means 59 is indicative of the logical function that either or both the first current pulse $I_A$ or the second current pulse $I_B$ is not present at the terminals 63 or 64 respectively.

Assume now that the first current pulse $I_A$ and the second current pulse $I_B$ occurs simultaneously on the terminals 63 and 64 respectively. For this condition, both the left and right sides of the gate element 51 of the second cryotron means become superconductive rendering the entire gate element 51 superconducting. Simultaneously, the first $I_A$ and second $I_B$ current pulses flow through the control elements 57 and 58 respectively of the first cryotron means respectively in opposite directions, which causes their magnetic fields to combine additively and renders the gate element 56 resistive. Accordingly, for this condition the current I applied to terminal 61 now flows through the control element 52, the gate element 51 of the second cryotron means, through the superconducting output means 60, the control element 55 and out of the terminal 62. The current I flowing through the superconducting output means 60 is indicative of the logical function that the first $I_A$ and second $I_B$ current inputs appear at the terminals 63 and 64 respectively. Upon termination of the first $I_A$ and second $I_B$ current pulses, the current I will again flow through the superconducting output means 59 and not through the superconducting output means 60.

The circuit illustrated in FIG. 3B operates as an AND gate with current flow through the superconducting output means 60 being indicative of the AND function and current flow through the superconducting output means 59 being indicative of the complement of the AND function. The operation of the circuit of FIG. 3B is such that current can flow in either the output means 59 or the output means 60 but never in both.

Figures 4, 5, 6:
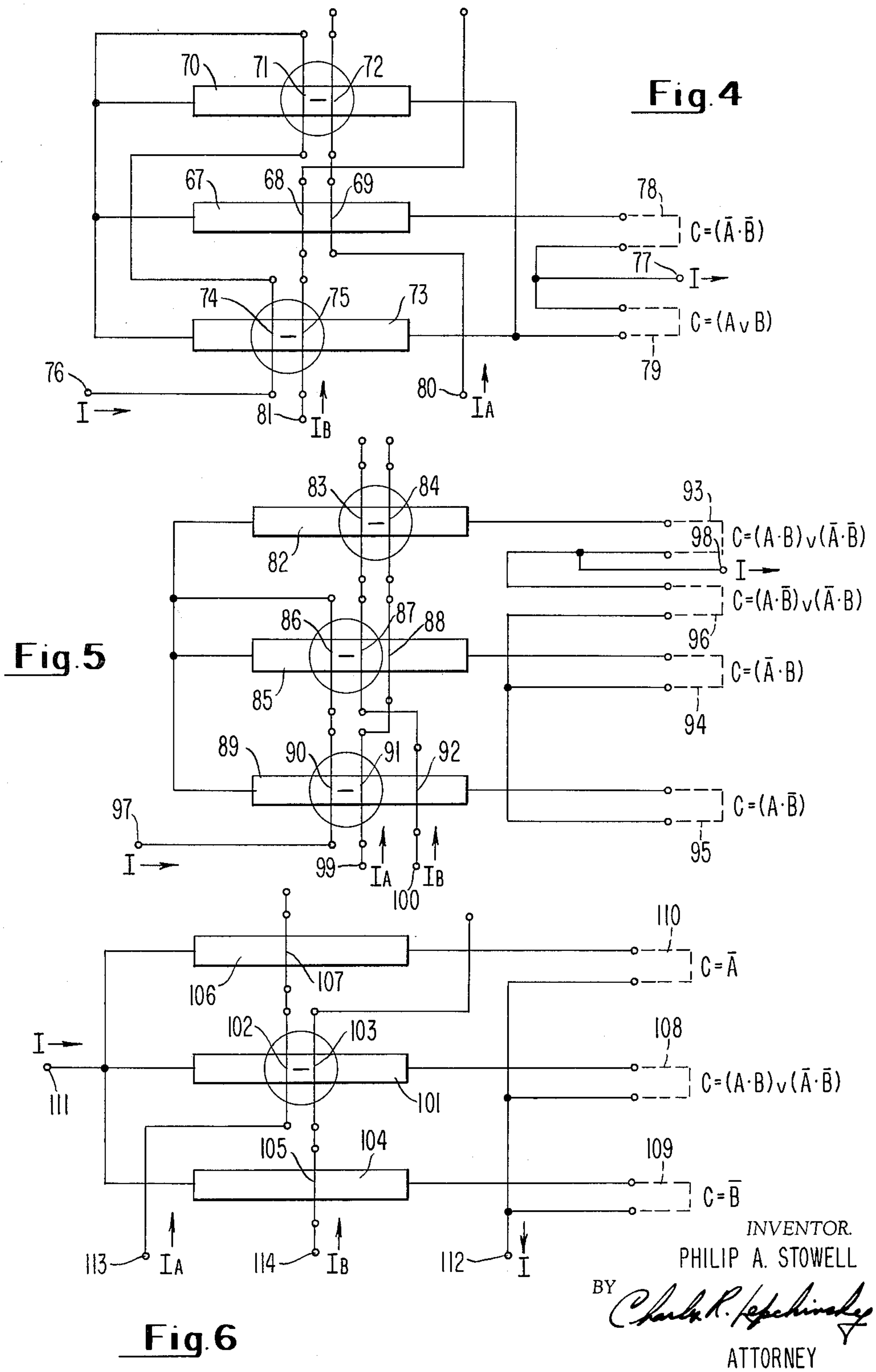
FIG. 4 is a schematic illustration of a superconducting logical OR circuit.
FIG. 5 is a schematic illustration of a superconducting logical EXCLUSIVE OR circuit.
FIG. 6 is a schematic illustration of a protected superconducting logical flip flop circuit.

Referring now to FIG. 4, there is illustrated in schematic diagram form, a superconducting OR gate including a first cryotron means comprising the gate element 67 and the two noninteracting control elements 68 and 69, second cryotron means including the gate element 70 and two subtractively interacting control elements 71 and 72, and third cryotron means comprising the gate element 73 and the two subtractively interacting control elements 74 and 75. The gate elements of each of the cryotron means are connected in parallel to form three parallel current paths. A source of current I is applied between the terminals 76 and 77. Superconducting output means 78 is adapted to receive the current that flows through the gate element 67 of the first cryotron means and superconducting output means 79 is adapted to receive the current that flows through the gate elements 70 and 73 of the second and third cryotron means respectively. The control elements of the first, second, and third cryotron means are each intercoupled to the control elements of one of the other cryotron means in a predetermined manner.

In the absence of a first $I_A$ or second $I_B$ current pulse which is applied to the terminals 80 and 81 respectively, the current I which is applied to terminal 76 flows through the control element 74 of the second cryotron means rendering its gate element 73 resistive, through the control element 71 of the third cryotron means rendering its gate element 70 resistive, through the gate element 67 of the first cryotron means, the superconducting output means 78 and out of the terminal 77. Assume now that a first current pulse $I_A$ is applied to the terminal 80 causing current to flow into the terminal 80. This current $I_A$ flows through the control element 69 of the first cryotron means which renders the gate element 67 resistive which in turn prevents any current I from flowing in the superconducting output means 78. Simultaneously, the first current pulse $I_A$ also flows through the control element 72 of the third cryotron means which renders the gate element 70 superconducting. This permits all the current I to flow through the gate element 70, through the superconducting output means 79, and out of the terminal 77. Upon termination of the first current pulse $I_A$, the current I will again flow through the superconducting output means 78 because the gate element 67 of the first cryotron means will again be superconducting and the gate elements 70 and 73 of the second and third cryotron means respectively will be resistive.

When the second current pulse $I_B$ appears on the terminal 81 causing current to flow into the terminal, it causes current $I_B$ to flow through the control element 75 of the third cryotron means which renders the gate element 73 superconducting and also flows through the control element 68 of the first cryotron means which renders the gate element 67 resistive thereby preventing any current I from flowing through the superconducting output means 78. All of the current I will now flow through the gate element 73 of the third cryotron means, through the superconducting output means 79 and out of the terminal 77.

When the first $I_A$ and second $I_B$ current pulses appear on the terminals 80 and 81 simultaneously, the gate element 67 of the first control means will be resistive thereby preventing the current I from flowing in the superconducting output means 78. However, the gate elements 70 and 73 of the second and third cryotron means will both be superconducting which allows current I to flow through either or both of them, through the superconducting output means 79, and out of the terminal 77. It is clear from the detailed description herein above that the current I flowing through the superconducting output means 79 is indicative that either or both the first current pulse $I_A$ or the second current pulse $I_B$ is present on the terminals 80 or 81 respectively, and that current only flows through the superconducting output means 78 when neither the first $I_A$ nor the second $I_B$ current pulses appears on the terminals 80 and 81 respectively. That is, current flow through the superconducting output means 79 is indicative of the logical OR function and current flow through the superconducting output means 78 is indicative of the complement of the logical OR function.

Referring now to FIG. 5 there is illustrated, in schematic diagram form, a superconducting EXCLUSIVE OR gate including first cryotron means comprising the gate element 82 and the two subtractively interacting control elements 83 and 84, second cryotron means comprising the gate element 85 the two subtractively interacting control elements 86 and 87 and a non-interacting control element 88, and third cryotron means comprising the gate element 89 having two subtractively interacting control elements 90 and 91 and a non-interacting control element 92. The gate elements 82, 85, and 89 of each of the cryotron means are connected in parallel to form three parallel superconducting current paths. Superconducting output means 93, 94, and 95 are serially connected in the superconducting current paths defined by the gate elements 82, 85, and 89 respectively. Superconducting output means 96 is adapted to receive the current that flows through the gate elements 85 and 89 of the second and third cryotron means respectively. A source of current I is connected between terminals 97 and 98 and the control elements of each of the cryotron means are intercoupled to one of the control elements of one, some or all of the cryotron means in a predetermined manner. The terminal 99 is adapted to receive a first current pulse $I_A$ and terminal 100 is adapted to receive a second current pulse $I_B$.

In the absence of a first current pulse $I_A$ on terminal 99 and a second current pulse $I_B$ on terminal 100, the current I flows into the terminal 97 through the control element 90 of the third cryotron means rendering the gate element 89 resistive, through the control element 86 of the second cryotron means rendering the gate element 85 resistive, through the gate element 82 of the first cryotron means, through the superconducting output means 93, and out of the terminal 98. Assume now that a first current pulse $I_A$ appears on terminal 99 which causes current to flow into terminal 99. This current $I_A$ flows through the control element 91 of the third cryotron means and subtractively interacts with the current I flowing into the control element 90, which flows in the same direction, thereby causing the gate element 89 to become superconducting. The current $I_A$ also flows through the non-interacting control element 88 of the second cryotron means rendering the right side of the gate element 85 resistive. The left side of the gate element 85 is also resistive due to the current I which flows through the control element 86. The first current pulse $I_A$ also flows through the control element 84 on the first cryotron means rendering the gate element 82 resistive. Since the gate elements 85 and 89 of the first and second cryotron means are resistive, the current I can only flow through the now superconducting gate element 89 of the third cryotron means through the superconducting output means 95, through the superconducting output means 96, and out of the terminal 98. Upon termination of the first current pulse $I_A$, the current I will again flow through the gate element 82 of the first cryotron means because the gate elements 85 and 89 of the second and third cryotron means will be rendered resistive due to the current I flowing in the control elements 86 and 90 respectively.

Assume now that a second current pulse $I_B$ appears on the terminal 100 causing current to flow into that terminal. This current $I_B$ flows through the non-interacting control element 92 of the third cryotron means rendering the right side of the gate element 89 resistive. The left side of the gate element 89 is already resistive due to the current I flowing in the control element 90. The second current pulse $I_B$ also flows through the control element 87 of the second cryotron means which subtractively interacts with the current I flowing in the control element 86 to cause the gate element 85 to become superconducting. The second current pulse $I_B$ also flows through the control element 83 of the first cryotron means which renders the gate element 82 resistive. Accordingly, since the gate element 85 of the second cryotron means is the only superconducting gate element, the current I flows through it, through the superconducting output means 94, through the superconducting output means 96, and out of the terminal 98.

Assume now that the first $I_A$ and second $I_B$ current pulse appears on the terminals 99 and 100 respectively at the same time. In a manner as described herein, this will cause the right side of the gate elements 85 and 89 of the second and third cryotron means to become resistive and also causes the gate element 82 of the first cryotron means to become superconducting. Accordingly the current I will flow through the gate element 82 of the first cryotron means, through the superconducting output means 93 and out of the terminal 98.

It is clear from the above description that the circuit of FIG. 5 functions as an EXCLUSIVE OR gate, the EXCLUSIVE OR function being generated whenever current flows through the superconducting output means 96. It is also clear that current I flows through the superconducting output means 93 indicates the function that both the first $I_A$ and second $I_B$ current pulses appear on the terminals 99 and 100 respectively, or that neither of them so appear, this function being the complement of the EXCLUSIVE OR function. Current I flows through the superconducting output means 94 indicates that the first current pulse $I_A$ does not appear on the terminal 99 and that the second current pulse $I_B$ does appear on the terminal 100, and current flow through the superconducting output means 95 indicates that the first current pulse $I_A$ appears on the terminal 99 and the second current pulse $I_B$ does not appear on the terminal 100.

Heretofore in the prior art a superconducting logical bistable or flip-flop circuit has been constructed by connecting the gate elements of two thin film cryotrons in parallel, the control element of each cryotron being adapted to receive a set and reset pulse respectively. When both pulses occur simultaneously both gate elements were rendered resistive causing the flip-flop to continuously dissipate energy because of the absence of a superconducting current path. This undesirable result is eliminated by the superconducting logical bistable circuit illustrated in schematic form in FIG. 6. Reference to FIG. 6 shows that the logical bistable or flip-flop circuit includes first cryotron means comprising the gate element 101 having two subtractively interacting control elements 102 and 103, second cryotron means comprising the gate element 104 with its associated control element 105, and third cryotron means comprising the gate element 106 with its associated control element 107. The gate elements of each of the cryotron means are connected in parallel to form three superconducting current paths. Connected in series in the first, second and third parallel current path are superconducting output means 108, 109, and 110 respectively. The control elements of each of the cryotron means are connected to one of the control elements of the other cryotrons in a predetermined manner. A source of current I is applied between terminals 111 and 112. A terminal 113 is adapted to receive a first current pulse $I_A$ and a terminal 114 is adapted to receive a second current pulse $I_B$.

Prior to the arrival of a first $I_A$ or second $I_B$ current pulse, each of the gate elements 101, 104, and 106 of the first, second and third cryotron means respectively are superconducting and the current I enters the terminal 111 divides and flows in parallel through each of the gate elements 101, 104 and 106, through each of the superconducting output means 108, 109, and 110 and out of the terminal 112.

When a first current pulse $I_A$ appears on terminal 113 causing current $I_A$ to flow into that terminal, current $I_A$ also flows through the control element 102 of the first cryotron means which renders its gate element 101 resistive and through the control element 107 of the third cryotron means which renders the gate element 106 resistive. For this condition only the gate element 104 of the second control cryotron means is superconducting therefore all of the current I will flow through it and through the superconducting output means 109 and out of the terminal 112. After termination of the first current pulse $I_A$ the gate elements 101 and 106 of the first and third control means respectively will again become superconducting. However, all of the current I will continue to flow through the gate element 104 of the second cryotron means, through the superconducting output means 109 and out of the terminal 112 because there can be no flux change in a superconducting circuit, hence no E.M.F. is available to effect a redistribution of the current I.

Subsequent to the termination of the first current pulse $I_A$ assume that a second current pulse $I_B$ appears on a terminal 114 causing current $I_B$ to flow into the terminal 114. This current $I_B$ also flows through the control element 105 of the second cryotron means rendering the gate element 104 resistive and also flows through the control element 103 of the first cryotron means rendering the gate element 101 resistive. Because the gate element 106 of the third cryotron means is the only superconducting gate element, all of the current I will flow through it, through the superconducting output means 110 and out of the terminal 112. Upon termination of the second current pulse $I_B$, the gate elements 101 and 104 of the first and second cryotron means will again become superconductive. However, since there can be no net flux change, all of the current I will continue to flow through the gate element 106 of the third cryotron means, through the superconducting output means 110 and out of the terminal 112.

Assume now that the first $I_A$ and second $I_B$ current pulses appear simultaneously. The first current pulse $I_A$ will render the gate element 106 of the third cryotron means resistive in a manner as described hereinabove, and the second current pulse $I_B$ will render the gate element 104 of the second cryotron means resistive in a manner also previously described herein. The first $I_A$ and second $I_B$ current pulses flow in the same direction through the subtractively interacting control elements 102 and 103 respectively of the first cryotron means which renders the gate element 101 superconducting. Accordingly, when both inputs appear simultaneously a superconducting current path for the current I appears through the gate element 101 through the superconducting output means 108 and out of the terminal 112. It is clear then that the circuit of FIG. 6 does not have a continuous energy dissipation state when both inputs $I_A$ and $I_B$ appear simultaneously. Also, current flow through the superconducting output means 110 is indicative of the current absence of the first current pulse $I_A$ and the current or just past presence of the second current pulse $I_B$ in concurrence with the absence of the first current pulse $I_A$. Current flow through the superconducting output means 108 is indicative of the current presence of both the first $I_A$ and second $I_B$ current pulses, or of the just past concurrent presence of both the first $I_A$ and second $I_B$ current pulses and the present absence of either one, and current flow through the superconducting output means 109 is indicative of the current absence of the second current pulse $I_B$ and the current or just past presence of the first current pulse $I_A$ and the concurrent absence of the second current pulse $I_B$. It will be seen from the foregoing that the concurrent absence of both the first current pulse $I_A$ and the second current pulse $I_B$ is a don't care condition for this circuit. Also, it is clear from the above, that the circuit of FIGURE 6 will remain in the state into which it was set by the last occurring current pulse $I_A$ or $I_B$.

It is to be understood that the superconducting logic circuits set forth in FIGURES 2 through 6 are illustrated in schematic form only. As will be obvious to those skilled in the art, the physical fabrication of these circuits can take many forms. The present invention is not limited by the various configurations possible in physically constructing the circuits described herein from various superconducting materials. For purposes of simplicity, the schematic diagrams do not indicate the layer of insulation that always separates crossed superconducting elements or leads. Also, FIGS. 2 through 6 illustrate various control elements being interconnected by superconducting leads. For example, in FIG. 3B the superconducting lead 65 connects the control element 53 to the control element 57. As will be obvious to those skilled in the art, it is possible, in constructing thin film superconducting circuits, to eliminate some or all of the interconnecting leads shown in Applicant's FIGS. 2 through 6. Further, FIGS. 2 through 6 illustrate using a plurality of superconducting output means. As will be obvious to those skilled in the art, each circuit need only have one output means indicative of the logical function desired. And finally, it will be apparent, from the descriptions given for the additively interacting and subtractively interacting control configurations respectively of FIGS. 1B and 1C, that these two cryotron devices are functionally interchangeable by reversing the relative direction of one of the two control current pulses, whereby it will also be apparent that the logical circuits of FIGS. 2 through 6 may each or any one be modified by the exchange of one or more subtractively interacting control cryotrons for a like number of additively interacting control cryotrons, or vice versa, by reversing the direction of flow of one control current through each interacting control so modified, with no effect on the functional behavior of the logical circuit so modified.

A plurality of superconducting logic circuits has been described wherein each logic circuit comprises a plurality of parallel superconducting current paths. Associated with each parallel current path is at least one cryotron having a gate portion and a control portion. At least one of the cryotrons has a single gate element and at least two interacting control elements. Means are provided for applying an input to selected ones of cryotrons and the cryotrons are intercoupled in such a manner that the implementation of the desired logical function in one or more of the parallel current paths is accompanied by the implementation of the logical complement in the totality of the remaining parallel current paths.

It is to be understood, of course, that the foregoing disclosure relates only to preferred embodiments of the present invention and that numerous modifications or alterations may be made therein without departing from the spirit and scope of this invention as set forth in the appended claims.

What is claimed is:

1. A superconducting logic circuit comprising:
a plurality of parallel superconducting current paths,
thin-film cryotron means associated with each said parallel current path,
at least one of said cryotron means having a plurality of interacting control elements positioned thereon to produce opposing magnetic fields therein upon the simultaneous application thereto of a plurality of current sources of corresponding polarity,
at least one of said plurality of control elements commonly connected in series with all of said plurality of parallel current paths to receive a first control signal of a first polarity and at least one other of said plurality of control elements serially connected with a control element of another of said thin-film cryotron means to receive a second control signal of a corresponding polarity and thereby provide a logical switching circuit capable of automatically resetting itself at the termination of an input switching control signal.

2. A superconducting logic circuit comprising:
a plurality of parallel superconducting current paths,
at least one thin-film cryotron, having a gate portion and a control portion, associated with each said parallel current path,
at least one of said cryotrons having a single gate element and at least two interacting control elements, positioned thereon to produce opposing magnetic fields therein upon the simultaneous application thereto of a plurality of control signals of similar polarity and to produce aiding magnetic fields therein when said signals are of dissimilar polarity,
at least one of said plurality of control elements commonly connected in series with all of said plurality of parallel current paths and at least one other of said plurality of control elements serially connected with a control element of another of said thin-film cryotron means to thereby provide a superconductive logical switching circuit capable of automatically resetting itself at the termination of an input switching control signal.

3. A superconducting logic circuit comprising:
a plurality of parallel superconducting current paths,
at least one cryotron, having a gate portion and a control portion, connected in series in each said parallel current path,
at least one of said cryotrons having a single gate element and at least two interacting control elements located with said single gate element positioned therebetween such that the magnetic field applied to said gate element by passing current in the same direction through said interacting control elements is the difference of the magnetic fields produced by each said control element,
at least one of said plurality of control elements commonly connected in series with all of said plurality of parallel current paths and at least one of said plurality of control elements serially connected with a control element of another of said cryotron means to thereby provide a logical switching circuit capable of automatically resetting itself at the termination of an input switching control signal.

4. A superconducting logic circuit comprising:
a plurality of parallel superconducting current paths,
at least one thin film cryotron, having a gate portion and a control portion, associated with each said parallel current path,
said gate portion of each said cryotron being serially connected in its associated current path,
at least one of said cryotrons having a single gate element and at least two interacting control elements with said single gate element located intermediate said control elements such that a simultaneous flow of current in opposing directions through said plurality of thin-film control elements produces a magnetic field corresponding in magnitude to that produced by a single current flow and equal to the absolute sum of the individual control current magnitudes.

5. A superconducting logic circuit capable of performing a logical NOT operation comprising:
first cryotron means,
second cryotron means having first and second interacting control elements respectively positioned adjacent opposite surfaces of the gate element of said cryotron means with said gate element located intermediately therebetween,
said cryotron means being connected in parallel to form a first parallel current path which is the implementation of the logical inverter function and to form a second parallel current path which is the implementation of the complement of the logical inverter function,
means for applying a constant current input to said first and second cryotron means, and
means intercoupling said first and second cryotron means such that the current flowing from said constant current source passes through said second control means in a direction coresponding to the direction of current flow initiated in said first control means by the application of control signal thereto, whereby a logical switching circuit is provided capable of automatically restoring itself to its initial condition after responding to the presence of an input switching control signal.

6. A superconducting logic circuit capable of performing a logical NOT operation comprising:
first thin-film cryotron means having at least a gate element and a control element,
a second thin-film cryotron means having at least a gate element positioned between a first and a second interacting control elements,
a constant current source,
said gate element of said first and second cryotron means being connected to said constant current source in parallel to form a first parallel current path which is the implementation of the logical inverter function and to form a second parallel current path which is the implementation of the complement of the logical inverter function,
said control element of said first cryotron means serially connected to said first control element of said second cryotron means and adapted to receive a current to be logically inverted, and
said second control element of said second cryotron means adapted to receive the current that may flow in said first or said second parallel current paths from said constant current source.

7. A superconducting logic circuit capable of performing a logical NOT operation comprising:
a first thin-film cryotron having a gate element and a control element,
a second thin film cryotron having a gate element and first and second interacting control elements such that the magnetic field applied to said gate element by passing current in the same direction through said first and second control elements is the difference between the individual magnetic fields produced by each of said first and second control elements,
said gate elements of said first and second cryotrons being connected in parallel to form a first parallel current path which is the implementation of the logical inverter function and to form a second parallel current path which is the implementation of the complement of the logical inverter function,
said control element of said first cryotron serially connected to said first control element of said second cryotron and adapted to receive a current to be logically inverted, and
said second control element of said second cryotron serially connected in said first and said second parallel current paths.

8. A superconducting logic circuit capable of performing a logical NOT operation comprising:
a first thin film cryotron having a gate element and a control element,
a second thin film cryotron having a gate element and first and second interacting control elements such that the magnetic field applied to said gate element by passing current in opposite directions through said first and second control elements is the sum of the individual magnetic fields produced by each of said first and second control elements,
a constant current source,
said gate elements of said first and second thin film cryotron being connected to said constant current source in parallel to form a first parallel current path which is the implementation of the logical inverter function and to form a second parallel current path which is the implementation of the complement of the logical inverter function,
said control element of said first cryotron serially connected to said first control element of said second cryotron and adapted to receive a current to be logically inverted, and
said control element of said second cryotron adapted to receive the current that may flow in said first and said second parallel current paths.

9. A superconducting AND gate comprising:
at least two parallel superconducting current paths,
at least one thin-film cryotron associated with each said current path, a first one of said cryotrons having a gate element and at least two interacting control elements such that the magnetic field applied to said gate element by passing current in the same direction through said interacting control elements is the difference of the individual magnetic fields produced by each said control element, a second of said cryotrons having a gate element and at least two pairs of such interacting control elements also connected to pass current in the same direction and achieve a corresponding reduction of magnetic force relative to its gate element, the gate element of each of said cryotrons being serially connected in its associated current path, means for applying inputs to one control element of each interacting pair on said second cryotron, each of which is in turn serially connected to a separate control element of said first cryotron, and means intercoupling the remaining control elements of the second cryotron serially in the common current path of said parallel connected gate elements.

10. A superconducting OR gate comprising:

at least a first thin film cryotron having a gate element with a first and a second non-interacting control element, at least a second and third thin-film cryotron each having a gate element with a first and a second interacting control element such that the magnetic field applied to said gate element by passing current in the same direction through said first and second interacting control elements is the difference of the individual magnetic fields produced by each of said first and second control elements, said first interacting control elements of the second and third cryotrons being serially connected between a constant current source and a common connection of all said gate elements, said gate elements of said cryotrons in turn being connected in parallel to form at least three parallel current paths, means for applying a first and a second signal current respectively to a first and a second series circuit, said first series circuit including the second interacting control element of the second cryotron and the first non-interacting control element of the first cryotron and said second series circuit including the second interacting control element of the third cryotron and the second non-interacting control element of the first cryotron.

11. A superconducting EXCLUSIVE OR gate comprising:

three parallel superconducting current paths, one thin-film cryotron associated with each said parallel current path, each of said cryotrons having a gate element and at least two interacting control elements positioned adjacent said gate element such that the magnetic field applied to said gate element by passing current in the same direction through said interacting control elements is the difference of the individual magnetic fields produced by each said control element, the gate element of each said cryotron being serially connected in its associated current path, at least two of said cryotrons having at least one non-interacting control element, constant current means commonly connected to the gate elements of all three cryotrons through a series circuit formed by interconnecting one interacting control element on each of the cryotrons having a non-interacting control element, and means for respectively supplying first and second signal currents to first and second groups of serially connected control elements, each of said groups including a non interacting control element on one of said cryotrons and an interacting control element on each of the remaining two cryotrons.

12. A superconducting protected bistable circuit comprising:

at least three parallel superconducting current paths, commonly connected to a constant current source, at least one thin film cryotron associated with each said parallel current path, two of said cryotrons having a gate element and a single control element, the other said cryotron having a gate element positioned between a first and a second interacting control element such that the magnetic field applied to said gate element by passing current in the same direction through both of said interacting control elements simultaneously is the difference of the magnetic fields produced by each control element, said gate element of each said cryotron being serially connected in its associated current path, means for respectively applying signal current to a first and a second series circuit, said first series circuit including said first interacting control element and one of said single control elements, and said second series circuit including the second interacting control element and the remaining single control element to provide a bistable circuit capable of protecting its contents by remembering the last state in which it resided prior to receiving an input signal to which it should not respond.

References Cited by the Examiner

UNITED STATES PATENTS

| | | | |
|---|---|---|---|
| Re. 25,403 | 6/1963 | Richards | 307—88.7 |
| 2,832,897 | 4/1958 | Buck | 340—173.1 |
| 2,966,598 | 12/1960 | Mackay | 307—88.5 |
| 2,980,807 | 4/1961 | Groetzinger et al. | 307—88.5 |
| 3,031,586 | 4/1962 | Anderson | 307—88.5 |
| 3,081,406 | 3/1963 | Steinbuch et al. | 307—88.5 |
| 3,088,040 | 4/1963 | Newhouse | 307—88.5 |
| 3,093,754 | 6/1963 | Mann | 307—88.5 |
| 3,105,200 | 9/1963 | Slade | 330—62 |
| 3,119,076 | 1/1964 | Schlig et al. | 330—62 |
| 3,122,653 | 2/1964 | Sanborn | 307—88.5 |
| 3,171,035 | 2/1965 | Clauser | 307—88.5 |
| 3,175,197 | 3/1965 | Miller et al. | 307—88.5 |

OTHER REFERENCES

IBM Technical Disclosure Bulletin; vol. 3, No. 11, April 1961, page 52, Sanborn.

IBM Technical Disclosure Bulletin: vol. 4, No. 7, December 1961, page 100, Smith et al.

JOHN W. HUCKERT, *Primary Examiner.*

ARTHUR GAUSS, *Examiner.*

B. P. DAVIS, *Assistant Examiner.*